(12) United States Patent
Chen et al.

(10) Patent No.: US 6,975,513 B2
(45) Date of Patent: Dec. 13, 2005

(54) CONSTRUCTION FOR HIGH DENSITY POWER MODULE PACKAGE

(75) Inventors: Da-Jung Chen, Taoyuan (TW); Chin-Hsiung Liao, Chu-pei (TW)

(73) Assignee: Cyntec Co., Ltd., Hsinchu (TW)

( * ) Notice: Subject to any disclaimer, the term of this patent is extended or adjusted under 35 U.S.C. 154(b) by 160 days.

(21) Appl. No.: 10/437,183

(22) Filed: May 14, 2003

(65) Prior Publication Data

US 2004/0228097 A1 Nov. 18, 2004

(51) Int. Cl.[7] .............................................. H05K 7/20
(52) U.S. Cl. .................. 361/719; 361/717; 361/718; 257/675; 257/717
(58) Field of Search ................ 361/702–710, 361/721–728, 732–738, 748–756, 760, 765, 361/717–719, 772–774, 777–778; 257/678, 257/683, 686, 689, 679, 690–698, 607, 707–726, 257/666, 687, 692, 701; 474/52.1, 52.2, 16.3, 474/252, 256, 52.4; 165/802, 185, 803; 363/144, 363/146, 147

(56) References Cited

U.S. PATENT DOCUMENTS

| | | | |
|---|---|---|---|
| 5,077,595 A * | 12/1991 | Fukunaga | 257/659 |
| 5,198,964 A * | 3/1993 | Ito et al. | 361/717 |
| 5,598,031 A * | 1/1997 | Groover et al. | 257/668 |
| 5,767,573 A * | 6/1998 | Noda et al. | 257/675 |
| 5,895,966 A * | 4/1999 | Penchuk | 257/690 |
| 5,942,797 A * | 8/1999 | Terasawa | 257/723 |
| 6,060,772 A * | 5/2000 | Sugawara et al. | 257/678 |
| 6,362,964 B1 * | 3/2002 | Dubhashi et al. | 361/707 |
| 6,822,338 B2 * | 11/2004 | Aono et al. | 257/784 |

FOREIGN PATENT DOCUMENTS

EP 0774782 A2 * 5/1997 ......... H01L 23/433

* cited by examiner

*Primary Examiner*—Michael Datskovskiy
(74) *Attorney, Agent, or Firm*—Troxell Law Office, PLLC

(57) ABSTRACT

A high-density power module package wherein the circuits and a part of chips of the power module are formed on respective substrates such that the circuit patterns are not influenced by the chips. Accordingly, the density of the circuit can be improved so as to save the required area of substrate and production cost.

5 Claims, 4 Drawing Sheets

CONSTRUCTION FOR HIGH DENSITY POWER MODULE PACKAGE

BACKGROUND OF THE INVENTION

1. Field of the Invention

The present invention relates to a newly designed power module package, and more particularly to a high-density power module package which is characterized in having the property of high heat dissipation, easiness in fabricating the lead frame, and low production cost.

2. Description of the Prior Art

The conventional power module packages can be classified in three categories, namely:

(1) The first one is shown in FIG. 1A and FIG. 1B, wherein a high heat dissipation substrate 100 made of a high molecular insulation layer and a metal foil layer is prepared as a base substrate. All power pack module circuits and a plurality of chips 101, 102, 103 . . . are fabricated on the surface of the substrate 100. After that the module circuits and lead frames 121, 122, or the chips 101, 102 . . . and the lead frames 121, 122 . . . are electrically connected by wires 111, 113 . . . or by wires 112 . . . respectively utilizing the wire bonding technique.

No matter how simple and easy to fabricate, the structure of the above described power module package has the following shortcomings:

1. Density of the power pack module circuits cannot be raised by reason that all the power pack module circuits and the chips are fabricated on the same substrate.
2. The foregoing, shortcoming described in § 1 calls for a larger substrate to compensate for that leads to increasing the production cost.
3. The instantaneous heat conduction ability is poor since heat conduction relies only on the heat dissipation paste applied between the substrate 100 and the heat sink (not shown) which is formed on the outer surface of the substrate 100 for dissipating heat produced by those chips 101, 102 . . . on the power pack module circuits and being conducted to the substrate 100.

(2) The second example is shown in FIG. 2A and FIG. 2B, wherein a metal plate 200 is further attached to the bottom surface of the high heat dissipation substrate 100 for fabricating all the power pack module circuits and attaching chips 101, 102, 103 . . . on the substrate 100. Thereafter, the module circuits and the lead frames 121, 122, or the chips 101, 102 . . . and the lead frames 121, 122 . . . are electrically connected by wires 111, 113 . . . , or wires 112 . . . respectively utilizing the wire bonding technique.

No matter how simple and easy to fabricate, and how advantageous in better heat dissipation by the metal plate 200 attached to the bottom surface of the substrate 100, the above-mentioned structure is unable to be released from the following shortcomings:

1. Density of the power module circuits cannot be raised by reason that all the power module circuits and the chips are fabricated on the same substrate.
2. The foregoing shortcoming described in § 1 calls for a larger substrate for remedy that leads to increasing the production cost.

(3) The third example is shown in FIG. 3A and FIG. 3B, wherein the lead frames 121, 122 . . . are directly patterned on a metal substrate 200 integrally with the power module circuits and the chips 101, 102 . . . are also directly welded to (or using other means) the lead frames.

With this structure, there is established a heat conduction route for chips 101, 102 . . . lead frames 121, 122 . . . →thin wall of the package material→metal plate 200→heat sink.

No matter how simple and easy to fabricate, the structure of the above described power module package has the following shortcomings:

1. The density and precision of both circuits and overall structure of the power module package are restricted by reason that the lead frames and overall circuit patterns are integrally formed in one piece.
2. Efficiency of heat dissipation is limited by the fact that heat conduction of chips shall be en route to the metal plate by way of the package material.

In order to solve the above described problems, the present inventor carried out theoretical studies and stimulating experiments. Based on these studies and researches, the present invention came to propose the present invention.

SUMMARY OF THE INVENTION

Accordingly, it is a first object of the present invention to provide a power module package in which the circuit density can be improved.

To achieve this object, the circuits and chips are respectively formed on different plates or different boards so that existence of the chips never affects the layout of the circuit pattern thereby improving the circuit density.

It is a second object of the present invention to provide a power module package whose substrate area is reduced to save the production cost.

To achieve this object, the circuit density of this power module package is raised.

It is a third object of the present invention to provide a power module package which has an excellent heat conducting property.

To achieve this object, the heat produced by the power chips on circuit board are directly transmitted to the metal plate, while the heat occurred on the circuit board are directly dissipated from the metal plate without being en route to the metal plate by way of the poor thermal conductive package material.

It is a fourth object of the present invention to provide a power module package which is able to withstand a very high temperature caused by an instantaneous huge current.

To achieve this object, the lead frames on the substrate are arranged in a planar configuration so as to facilitate heat conduction and assure a sufficient creepage distance so that the degree of product safety is greatly increased.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE PREFERRED EMBODIMENTS

The structures, advantages, and disadvantages concerning three examples of conventional power pack modules have been already described above; therefore, it is not necessary to discuss again.

Figure 1A:
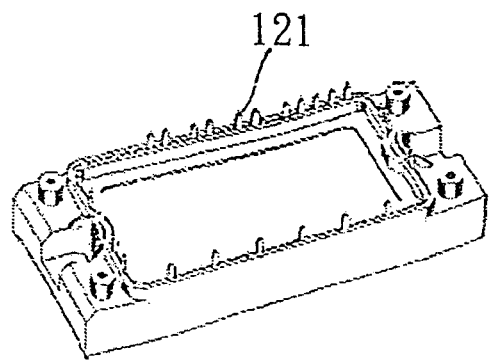
FIG. 1A is a three dimensional view of a conventional power module.
Figure 1B:
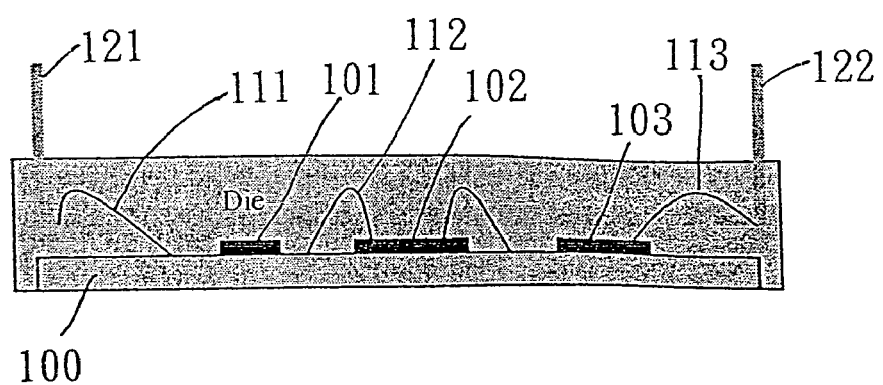
FIG. 1B is a longitudinal cross sectional view of FIG. 1A.
Figure 2A:
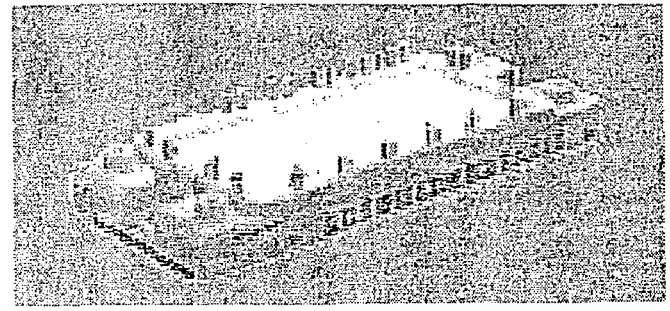
FIG. 2A is a three dimensional view of another conventional power module.
Figure 2B:
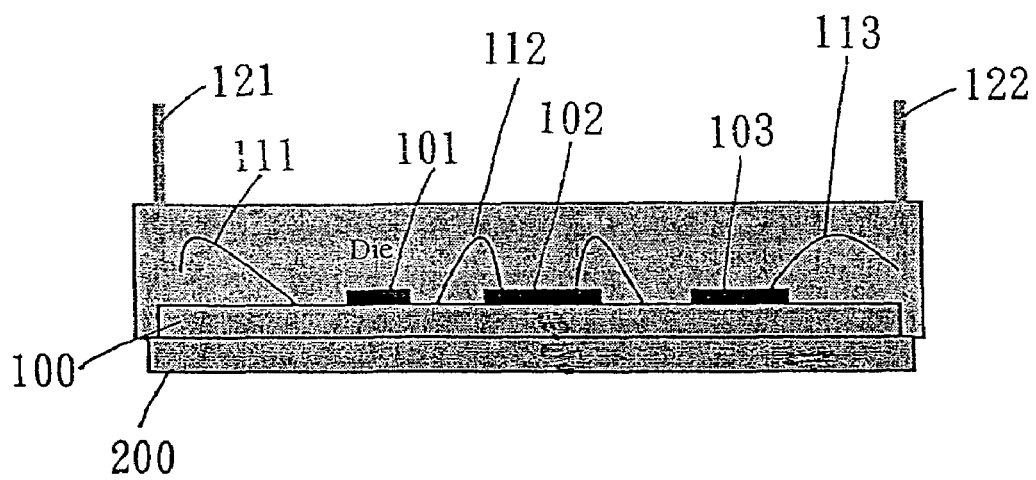
FIG. 2B is a longitudinal cross sectional view of FIG. 2A.
Figure 3A:
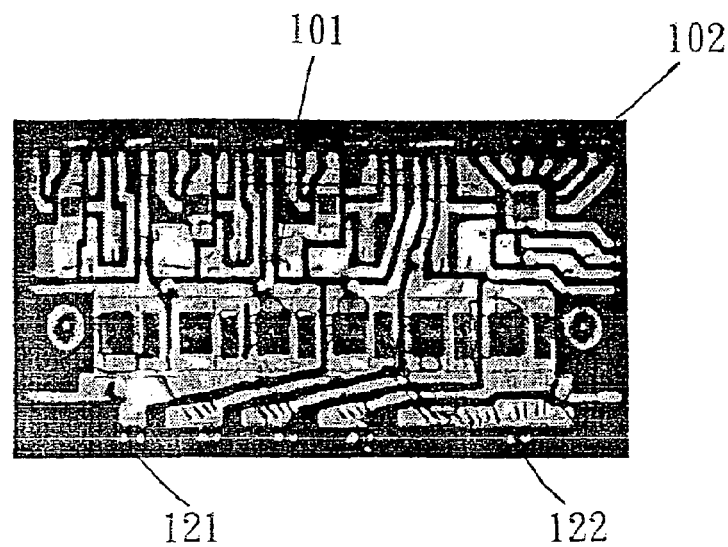
FIG. 3A is a schematic view showing the circuit layout pattern of one more example of a conventional power module.
Figure 3B:
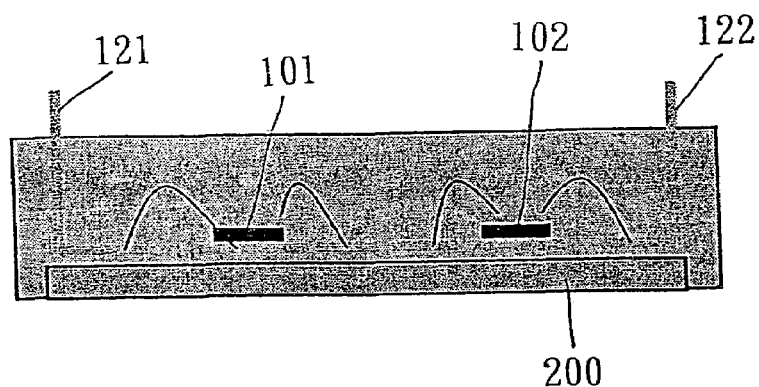
FIG. 3B is a longitudinal cross sectional view of FIG. 3A.
Figure 4A:
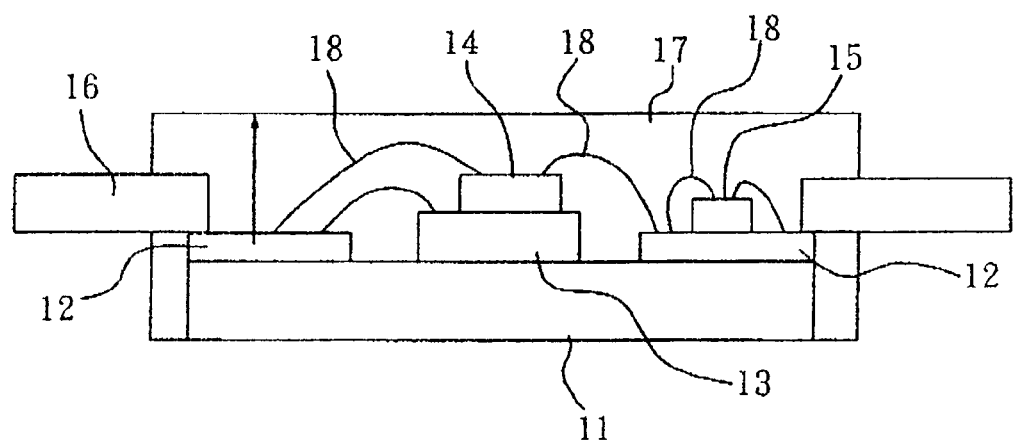
FIG. 4A is a plan view of a power module package of the present invention.
Figure 4B:
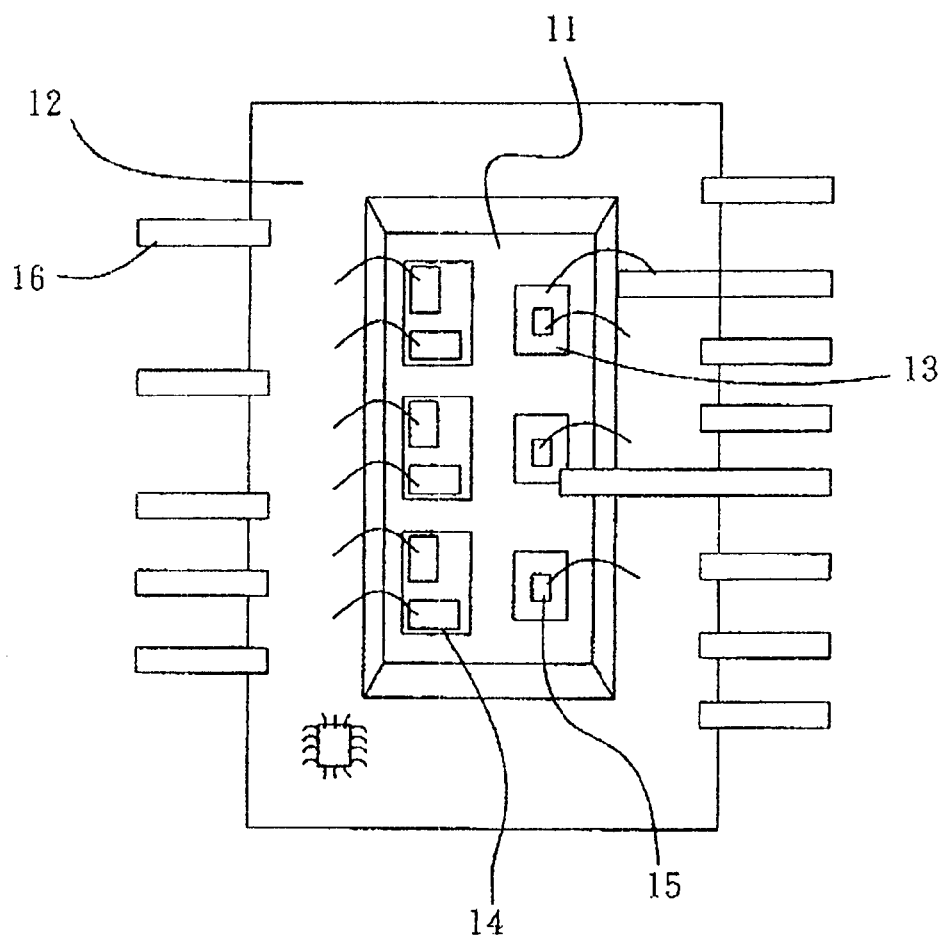
FIG. 4B is a longitudinal cross sectional view of FIG. 4A.

Referring to FIG. 4A and FIG. 4B, the power module package of the present invention is composed of a metal plate 11, a printed circuit board (PCB) 12, a substrate 13, a plurality of chips 14, 15 . . . , a plurality of lead frames 16, and a package material 17. The metal plate used as a substrate or a heat dissipation plate as well can be made of copper or aluminum. The PCB12 concentrates circuit patterns of the power pack module on it. The substrate 13 is preferably a high heat dissipation plate made of a high molecular insulation layer or a ceramic insulation layer and attached with a metal foil layer on each surface. The chips 14, 15 . . . are essentially fixed on the substrate 13, or partially fixed on a portion of the PCB12. The lead frames 16 is in contact with the PCB12. In fabricating the power module described above, at first the circuit of the power module is formed on the PCB12; and then the chips 14, 15 . . . are fixed on the substrate 13 at a present position; afterwards, the PCB 12 and substrate 13 are adhered on the metal plate 11, then put into the lead frames 16 so as to be connected to the circuit formed on the PCB12, and by pressure welded the chips 14, 15, the PCB12, and the wire 18 connected via the PCB 12 and the substrate 13, and then the structure is put into a case and infused with a packaging material 17 such that the present invention is obtained.

As it will be understood from the above description, the structure of the power module package according to the present invention is characterized in that the substrate 13 is a very thin high heat dissipation layer made of a high molecular insulation layer or a ceramic insulation layer attached with a metal foil layer on each surface. As a result, the cost of substrate material used is greatly reduced compared with that of any conventional one. Moreover, the design of overall circuits formed on the PCB12 contributes to improving the density and precision of the power pack module structure. Besides, the button surfaces of PCB and the substrate for chips 14 to attach are welded with the metal plate 11. By doing so, an excellent thermal conductivity is obtained which makes the structure being able to withstand a high temperature generated from a large instantaneous current and to have a sufficient creepage distance thereby greatly improving safety of the product.

From the above description, it is clearly understandable that the high density power module package of the present invention comprises the functions of increasing the circuit density and accuracy, excellent heat dissipation, low manufacturing cost and more secure in operation. These functions would improve the shortcomings happened in conventional power modules. It is an invention which is worthy for industrial utilizations.

Those who are skilled in the art will readily perceive how to modify the invention. Therefore the appended claims are to be construed to cover all equivalent structures which fall within the true scope and spirit of the invention.

What is claimed is:

1. A high density power module package comprising:
   a) a metal plate;
   b) a printed circuit board connected to a top of the metal plate and having circuit patterns;
   c) a substrate connected to the top of the metal plate;
   d) a plurality of chips, at least a first chip of the plurality of chips is connected to a top of the substrate and at least a second chip of the plurality of chips is connected to a top of the printed circuit board;
   e) a package material encapsulating the printed circuit board, the substrate, and the plurality of chips; and
   f) a plurality of lead frames connected to the circuit board and electrically connected to the substrate, the plurality of lead frames extending outwardly from the packaging material,
   wherein the plurality of chips are spaced apart from the plurality of lead frames and having the package material located therebetween.

2. The high density power module package according to claim 1, wherein the plurality of lead frames are connected to the circuit patterns of the printed circuit board.

3. The high density power module package according to claim 1, further comprising connecting wires connected between the lead frame, the plurality of chips, and the circuit patterns of the printed circuit board.

4. The high density power module package according to claim 1, wherein the substrate includes two metal foil layers and an insulation layer located between the two metal foil layers.

5. The high density power module package according to claim 1, wherein the plurality of lead frames are located in a common plane.

* * * * *